US006570199B1

United States Patent
Itoh

(10) Patent No.: US 6,570,199 B1
(45) Date of Patent: May 27, 2003

(54) SEMICONDUCTOR DEVICE AND METHOD OF MANUFACTURING THE SAME

(75) Inventor: Masanori Itoh, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 181 days.

(21) Appl. No.: 09/679,365

(22) Filed: Oct. 5, 2000

(30) Foreign Application Priority Data

Jun. 13, 2000 (JP) ........................................ 2000-176475

(51) Int. Cl.$^7$ .............................................. H01L 29/80
(52) U.S. Cl. ........................ 257/275; 257/664; 257/728; 257/758
(58) Field of Search ................................ 257/275, 276, 257/277, 664, 728, 758, 760; 333/238, 246

(56) References Cited

U.S. PATENT DOCUMENTS 5,151,772 A  *  9/1992  Takahashi et al. ............. 357/71
5,408,053 A  *  4/1995  Young ........................ 174/264
5,969,929 A  * 10/1999  Kleveland et al. ........... 361/111

* cited by examiner

*Primary Examiner*—Sara Crane
(74) *Attorney, Agent, or Firm*—Rabin & Berdo, P.C.

(57) ABSTRACT

A semiconductor device is provided which is capable of reducing direct current resistance in a signal line, of reducing a high-frequency resistance even in the case of transmitting high-frequency signals and, therefore, of increasing power gain when employed in, for example, an MMIC for high power. The semiconductor device has a microstrip line containing an interlayer dielectric and signal line formed on a semiconductor substrate on which predetermined circuit devices are mounted, wherein the signal line is made multi-layered with the interlayer dielectric interposed among the multiple layers and wherein the interlayer dielectric is made so thin that pin holes are produced and each layer constituting the signal line is electrically connected to each other through the pin holes.

6 Claims, 3 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and more particularly to the semiconductor device provided with a conductive path having a stacked structure.

2. Description of the Related Art

In a conventional semiconductor device such as an MMIC (Monolithic Microwave Integrated Circuit), conductive paths functioning as signal lines to connect circuit devices electrically and to transmit a high-frequency signal are formed on a semiconductor substrate made of, for example, GaAs (Gallium Arsenide) on which the circuit devices including active elements such as an FET (Field Effect Transistor) or a like or passive elements such as an inductor, capacitor, bonding pad or a like are mounted. The signal line, together with the semiconductor substrate on which the signal line is formed and with a dielectric composed of an insulating film formed between the semiconductor substrate and the signal line, constitutes a microstrip line. As the signal line constituting the microstrip line, the conductive path having a wiring structure, for example, in two layers up and down (that is, one above the other) is mounted.

Configurations of a conventional conductive path functioning as the signal line formed on the semiconductor device such as the MMIC will be hereinafter described by referring to FIGS. 7 and 8. FIG. 7 is a top view of a conventional microstrip line 400 having the signal line constructed in two layers up and down. Configurations of the conductive path functioning as the signal line of the microstrip line 400 will be described by referring to FIG. 8 which is a cross-sectional view of the signal line of FIG. 7 taken along the line D—D.

As shown in FIG. 8, on a substrate 402 made, for example, of GaAs is formed a first interlayer dielectric 404 having an approximately uniform thickness and at a predetermined place on the first interlayer dielectric 404 is formed a lower layer wiring 406 by a deposition method. At portions being exposed from the lower layer wiring 406 stacked on the first interlayer dielectric 404 and on the lower layer wiring 406 is formed a second interlayer dielectric 408. In the second interlayer dielectric 408 is formed a contact hole 410 so that the lower layer wiring 406 is partially exposed. At a predetermined place including portions of the contact hole 410 on the second interlayer dielectric 408 is formed an upper layer wiring 412 by a plating method and the upper layer wiring 412 is electrically connected through the contact hole 410 to the lower layer wiring 406. At portions being exposed from the upper layer wiring 412 stacked on the second interlayer dielectric 408 and on the upper layer wiring 412 is formed a passivation film 414. The upper layer wiring 412 described above is formed by a known lift-off method by using a resist film for forming an upper layer wiring (not shown). That is, first, the resist film is formed on the second interlayer dielectric 408. Then, patterning is performed on the resist film so as to form an aperture trench corresponding to the upper layer wiring 412. A metal for the upper wiring is embedded by the plating method and then the resist film together with unwanted metal accumulated on the resist film is removed. Therefore, the thickness of the upper layer wiring is determined by the thickness of the resist film for forming the upper layer wiring described above.

In the conventional conductive path functioning as the signal line, its resistance is made low by constructing the signal line so as to have the wiring structure stacked in two layers up and down, by forming the resist film for forming the upper layer wiring so as to have the large thickness and thus by forming the upper layer wiring having the thickness being as large as possible.

However, the conventional signal line has problems. That is, when the lift-off method is employed, since working accuracy is limited by a ratio of a width of the aperture trench to its depth (i.e., aspect ratio), limits are imposed on the thickness of the resist film for forming the upper layer wiring, i.e., on the thickness of the upper layer wiring. Because of this, in the case of, for example, a high-power MMIC, the conventional wiring structure poses serious limitations to the method in which a direct current resistance is made low by increasing the thickness of the upper layer wiring, thus actually making it impossible to fully lower the direct current resistance. Another problem with the conventional conductive path is that, when a high-frequency signal is transmitted, due to a skin effect that a current flows only on a surface of a conductor, even if an area of cross-section is made larger simply by increasing the thickness of the upper layer wiring, a resistance against high-frequency currents cannot be lowered practically.

SUMMARY OF THE INVENTION

In view of the above, it is an object of the present invention to provide a semiconductor device capable of sufficiently lowering an electrical resistance in a conductive path functioning as a signal line. It is another object of the present invention to provide a method for manufacturing, comparatively easily, the semiconductor device capable of sufficiently lowering the electrical resistance in the conductive path functioning as the signal line. It is still another object of the present invention to provide the semiconductor device capable of sufficiently lowering the electrical resistance in high-frequency signals in the conductive path.

According to a first aspect of the present invention, there is provided a semiconductor device including:

a semiconductor substrate;

a circuit device mounted on the semiconductor substrate;

an insulating film covering the circuit device; and a conductive path used for the circuit device mounted on the insulating film, whereby the conductive path has a stacked structure composed of a plurality of conductive layers and of interlayer dielectrics interposed among the conductive layers and allowing a partial connection among the conductive layers, and each of the conductive layers has approximately the same thickness.

In the foregoing, a preferable mode is one wherein the conductive path constitutes a part of a microstrip line being suitable for high-frequency currents.

Also, a preferable mode is one wherein a pin hole is formed in the interlayer dielectric which passes through the interlayer dielectric in a direction of its thickness and the conductive layers formed on both sides of the interlayer dielectric are connected to each other through the pin hole.

According to a second aspect of the present invention, there is provided a method for manufacturing a semiconductor device having a semiconductor substrate, a circuit device formed on the semiconductor substrate, an insulating film covering the circuit device and a conductive path used for the circuit device formed on the insulating film including steps of:

forming the insulating film covering the circuit device formed on the semiconductor substrate;

forming a conductive layer functioning as the conductive path on the insulating film;

forming, on the conductive layer, an interlayer dielectric having a pin hole;

forming, on the interlayer dielectric, other conductive layer being connected to the conductive layer through the pin hole, repeating, alternately, a process of forming, on the other conductive layer, a new interlayer dielectric having the pin hole and a process of forming, on the interlayer dielectric, a new conductive layer contacting, through the pin hole formed in the interlayer dielectric, the conductive layer disposed at a lower place; and performing patterning on a stacked body to form the conductive path composed of the stacked body containing the conductive layer and the interlayer dielectric.

In the foregoing, a preferable mode is one wherein each of the interlayer dielectrics is formed so as to have a thickness of several Å to several tens of Å by using a plasma enhanced CVD (Chemical Vapor Deposition).

Also, a preferable mode is one wherein the patterning is performed by using a selective etching method by which an unwanted portion being exposed out of a pattern mask having a shape corresponding to the conductive path is removed using an etching medium.

Also, a preferable mode is one wherein the patterning is performed by using a lift-off method by which the pattern mask having a shape corresponding to the conductive path is removed together with unwanted deposit existing on the pattern mask.

According to a third aspect of the present invention, there is provided a semiconductor device including:

a semiconductor substrate;

a circuit device formed on the semiconductor substrate;

an insulating film covering the circuit device; and a conductive path used for the circuit device formed on the insulating film;

whereby the conductive path has, at least, an upper conductive layer and a lower conductive layer, one extending on an approximately flat surface along the insulating film and the other having totally a wavy cross-sectional shape composed of a crest portion and a valley portion, either of which contacts the one extending in the manner described above.

In the foregoing, a preferable mode is one wherein the lower conductive layer extends along the flat surface of the insulating film and the upper conductive layer has a wavy cross-sectional shape in which its crest and valley portions are defined in up and down directions on the lower conductive layer and its valley portion contacts the lower conductive layer.

Furthermore, a preferable mode is one wherein an interlayer dielectric having a plurality of concave trenches used to cause the conductive layer to be exposed partially is formed on the lower conductive layer and wherein the upper conductive layer is formed in a continuous manner along concave and convex surfaces so that it covers a surface of the interlayer dielectric, circumferential surface of the concave trench and surface portion being exposed from the lower conductive layer toward the concave trench.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings. In descriptions and figures of the embodiment described below, a same reference number is assigned to any part having same functions and configurations and its double description is omitted.

First Embodiment

In a semiconductor device such as an MMIC of a first embodiment, as in the conventional semiconductor device, on a substrate made of, for example, GaAs, of the semiconductor device on which circuit devices including active devices such as an FET or a like or passive devices such as an inductor, capacitor, bonding pad or a like are formed, is formed a signal line functioning as a conductive path to electrically connect the circuit devices and to transmit a high-frequency signal. The signal line of the embodiment is constructed of multiple layers with interlayer dielectrics formed among the layers.

Figure 1:
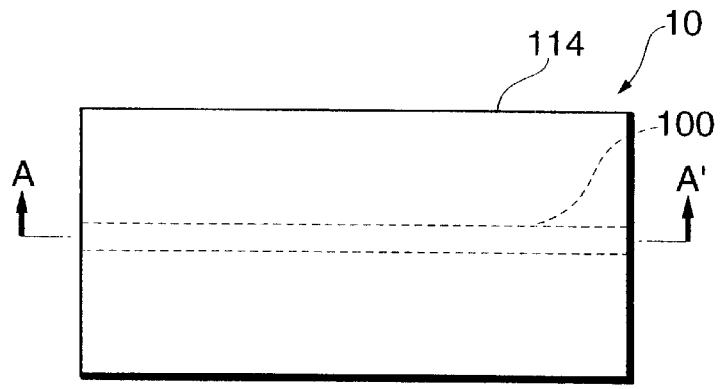
FIG. 1 is a top view of a microstrip line of a semiconductor according to a first embodiment of the present invention.
Figure 2:
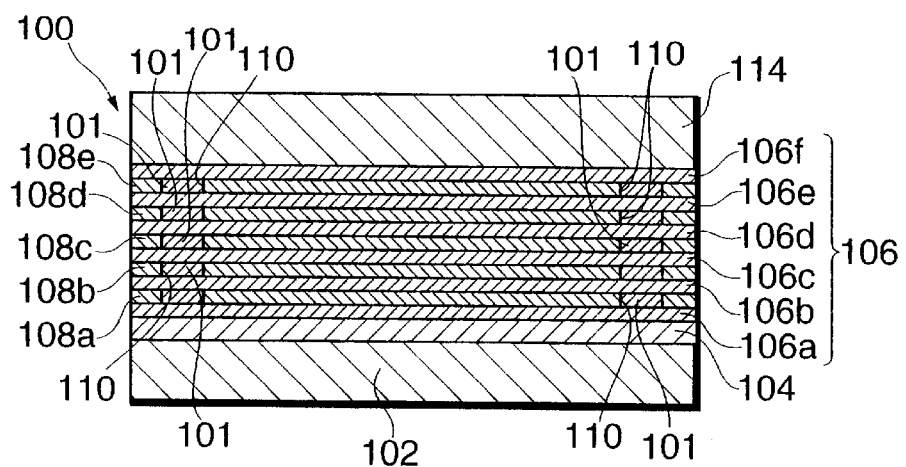
FIG. 2 is a cross-sectional view of the microstrip line of the semiconductor device of FIG. 1 taken along the line A–A' used to explain a signal line according to the first embodiment of the present invention.

Configurations of the signal line of the embodiment will be described below by referring to FIGS. 1 and 2. FIG. 1 is a top view of the microstrip line of the semiconductor according to the first embodiment of the present invention. FIG. 2 is a cross-sectional view of the microstrip line of the semiconductor device of FIG. 1 taken along the line A–A' used to explain the signal line according to the first embodiment. As shown in FIG. 1, the semiconductor device 10 of the embodiment contains the microstrip line 100. As shown in FIG. 2, the microstrip line 100 is composed of a semiconductor substrate 102, an insulating film 104 formed on the semiconductor substrate 102 and a conductive path 106 formed on the insulating film 104.

In the semiconductor device of the embodiment, on the semiconductor substrate 102 made of, for example, GaAs, are mounted, as in the conventional semiconductor devices, circuit devices including active devices such as an FET and a like or passive devices such as an inductor, capacitor, bonding pad or a like (not shown). The insulating film 104 has an approximately uniform thickness and is formed in a manner that it covers the semiconductor substrate 102 and the circuit devices mounted on the semiconductor substrate 102. The conductive path 106, though not shown, as in the conventional one, is connected to circuit devices existing under the insulating film 104 to function as the signal line when necessary. The conductive path 106 has a first conductive layer 106a extending in a belt-like manner at a predetermined place on the insulating film 104. The first conductive layer 106a, which also functions as the signal line, can be formed by a well-known selective etching method. In the selective etching method, conductive materials such as gold, aluminum or copper are first deposited on the insulating film 104, for example, by a deposition method and then a mask pattern having a shape corresponding to the conductive path 106 is formed on the deposit and the etching is performed using the mask pattern as an etching mask and with an etching medium such as etching gas or etching liquid so that unwanted portions of the deposit being exposed out of the etching mask are removed. To form the first conductive layer 106a, instead of the selective etching, the lift-off method may be employed. That is, a mask pattern having a shape corresponding to the conductive path 106 is formed in advance on the insulating film 104 and then the conductive materials are deposited uniformly on portions being exposed out of the mask pattern on the insulating film 104 and on the mask pattern by the deposition method and unwanted portions of the deposit on the mask pattern together with the mask pattern are removed. The first conductive layer 106a is, though not shown, connected to the circuit devices described above through a connecting section passing through the insulating film 104.

On the first conductive layer 106a, by the same selective etching method or lift-off method as described above, is formed a first interlayer dielectric 108a and on the interlayer dielectric 108a is formed, along the first conductive layer 106a, a second conductive layer 106b also functioning as the signal line by the same selective etching method or lift-off method as described above. In the first interlayer dielectric 108a is formed a contact hole 110 passing through the first interlayer dielectric 108a in a direction of its thickness by the selective etching using, for example, the etching mask. The second conductive layer 106b is connected electrically to the first conductive layer 6athrough a conductive connection section 101 passing through the contact hole 110. Moreover, on the second conductive layer 106b are stacked, alternately and sequentially, second, third, fourth and fifth interlayer dielectrics 108b, 108c, 108d and 108e each having the same configuration as the first interlayer dielectric 108a and third, fourth, fifth and sixth conductive layers 106c, 106d, 106e and 106f each having the same configuration as the first conductive layer 106a. The conductive layers 106b, 106c, 106d, 106e and 106f are connected electrically to each other through each of the conductive connection sections 101 of the contact holes 110 each being formed in each of the interlayer dielectrics 108b 108c, 108d and 108e and having the same configurations as those mounted in the interlayer dielectric 108a.

All of the conductive layers 106a to 106f have approximately the same thickness and all of the interlayer dielectrics 108a to 108e have approximately the same thickness. These conductive layers 106a to 106f and interlayer dielectrics 108a to 108e constitute a multi-layered conductive body 106 functioning as the signal line. On the multi-layered signal line 106 is formed a passivation film 114. As described above, patterning on each layer constituting the multi-layered stacked body is performed by using the selective etching method in which the etching is carried out on the deposited material layer using the etching mask. Also, as described above, in this process, instead of the selective etching method, the lift-off method can be used to produce the pattern for each layer. Furthermore, instead of performing the patterning, in turn, on each layer by the selective etching or the lift-off etching on each of stacked layers constituting the stacked body, after each of the layers is stacked, a collective patterning may be performed on the overall stacked body as well.

According to the first embodiment of the present invention, the multi-layered signal line 106 is formed by alternately stacking each conductive layer for a signal wiring and each interlayer dielectric. All the conductive layers have the same thickness and are stacked in multiple layers exceeding three layers. As a result, an area of cross-section and a surface area of the signal line 106 can be increased without causing an overall height of the signal line 106 to be increased and both a direct current resistance and an alternating current resistance against a high-frequency current exhibiting the skin effect can be lowered. Moreover, it is preferable to use the deposition method to form the conductive layer because it allows its surface area of the signal line 106 to be increased without causing its height to be increased and the conductive layer having a smaller thickness to be obtained.

Second Embodiment

In the first embodiment described above, by making the wiring structure multi-layered to increase the surface area of the wiring and by making each layer thin, the direct current resistance is lowered and the influence by the skin effect in the high-frequency signals is reduced. In a second embodiment, by making an interlayer dielectric thinner and by utilizing pin holes formed when the interlayer dielectric is made thin, electrical conductivity among layers of the wiring is implemented.

In the semiconductor device such as an MMIC of the second embodiment, as in the first embodiment, on a semiconductor substrate made of, for example, GaAs, on which active devices including an FET or a like and passive devices including an inductor, capacitor, bonding pad or a like, is formed a signal line stacked in multiple layers with an interlayer dielectric interposed among layers to be connected to the circuit devices to transmit a high-frequency signal. Unlike in the case of the first embodiment, the interlayer dielectric formed among conductive layers of the signal line is made so thin that the pin hole is produced in the interlayer dielectric during manufacturing process and this pin hole is used to provide continuity among layers of signal wirings.

Figure 3:
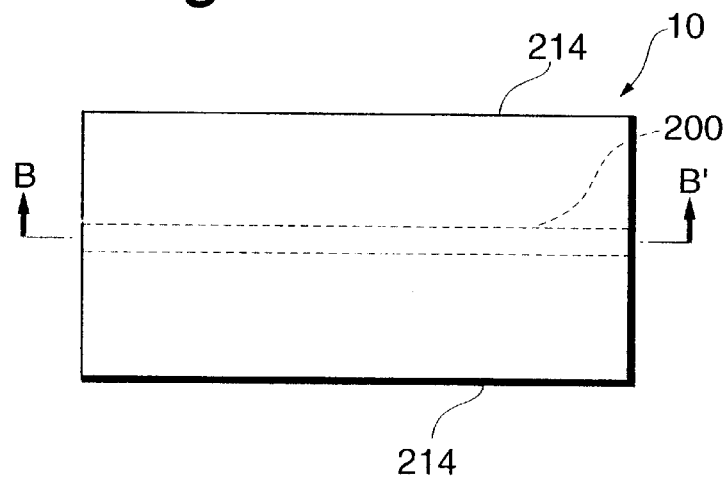
FIG. 3 is a top view of a microstrip line of a semiconductor according to a second embodiment of the present invention.
Figure 4:
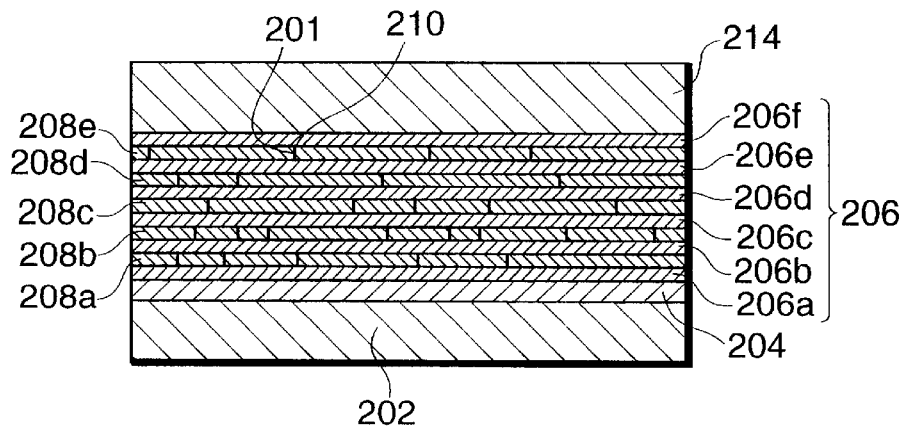
FIG. 4 is a cross-sectional view of the microstrip line of the semiconductor device of FIG. 3 taken along the line B–B' used to explain a signal line according to the second embodiment of the present invention.

Configurations of the signal line of the second embodiment will be described below by referring to FIGS. 3 and 4. FIG. 3 is a top view of a microstrip line of the semiconductor according to the second embodiment of the present invention. FIG. 4 is a cross-sectional view of the microstrip line of the semiconductor device of FIG. 3 taken along the line B–B' used to explain the signal line according to the second embodiment.

The semiconductor device of the second embodiment, as shown in FIG. 3, contains a microstrip line 200. The microstrip line 200, as shown in FIG. 4, unlike in the case of the first embodiment, is made so thin that the pin hole is produced in the interlayer dielectrics and, through this pin hole, the conductive layers of the signal line is electrically connected to each other. That is, on the semiconductor substrate made of, for example, GaAs, on which predetermined devices are formed an insulating film 204 having approximately uniform thickness and, at a predetermined place on the insulating film 204, a first conductive layer 206a of the signal line 206 functioning as the conductive path is formed by the deposition method.

On the first conductive layer 206a is stacked a first interlayer dielectric 208a. The interlayer dielectric 208a is formed by depositing insulating materials such as SiO$_2$ (silicon dioxide) or SiN (silicon nitride) on the first conductive layer 206, by using, for example, a plasma enhanced CVD method in a manner that the deposit becomes a thickness of several angstrom to several dozens of angstrom. Since the first interlayer dielectric 208a is formed so as to have so small thickness, the pin hole 210 passing through the interlayer dielectric 208a is produced. Moreover, on the first interlayer dielectric 208a is stacked a second conductive layer 206b constituting the signal line 206 by using, for example, the deposition method. At this point, electric continuity is provided, through the pin hole 210, between the first conductive layer 206a and the second conductive layer 206b.

In the same manner as for the interlayer dielectric 208a, on the second conductive layer 206b are formed second, third, fourth and fifth interlayer dielectrics 208b, 208c, 208d and 208e and, in the same manner as for the conductive layer 206a, on the second interlayer dielectric 208b are formed third, fourth, fifth and sixth conductive layers 206c, 206d, 206e and 206f, alternately and sequentially. The conductive layers 206b, 206c, 206d, 206e and 206f are electrically connected to each other through conductive connecting sections 201 passing through the pin holes functioning as contact holes 210 as described in the first embodiment. Furthermore, on the multi-layered signal line 206 is formed a passivation film 214 in the same manner as described in the first embodiment. Each of layers constituting the stacked bodies 206 and 208 can be formed through patterning in which the selective etching is carried out on each of material layers to be stacked, in order, using an etching mask. As described in the first embodiment, instead of the selective etching method, the well-known lift-off method may be employed in the above process. Moreover, instead of performing the patterning on each material layer constituting the stacked bodies by using the selective etching method or lift-off method, a collective patterning may be performed on the whole of the stacked bodies.

Thus, according to the second embodiment of the present invention, the pin hole 210 in the interlayer dielectric produced by making thin each of the interlayer dielectrics 208a to 208e can be used to provide the electrical continuity to each of the conductive layers 206a to 206f. As a result, since a process of forming a special contact hole is made unnecessary, a part of the manufacturing processes of semiconductor devices can be omitted, thus allowing the reduction in the number of processes. Moreover, each layer is made very thin, the signal line can be constructed in more multiple layers. This enables both the direct current resistance and the alternating current resistance against the high-frequency current exhibiting the skin effect to be lowered without causing the overall height of the signal line to be increased.

Third Embodiment

In the first and second embodiments described above, the signal line is constructed in multiple layers being three or more layers. However, according to the third embodiment, even in the case of the signal line having a wiring structure in two layers up and down, it is possible to increase an surface area of the wiring and to make its layer thinner.

In a semiconductor device such as an MMIC of the third embodiment, as in the first and second embodiments, on a semiconductor substrate made of, for example, GaAs, on which active devices including an FET or a like and passive devices including an inductor, capacitor, bonding pad or a like, is formed a signal line stacked in two layers up and down to be connected to the circuit devices to transmit a high-frequency signal. In the signal line of the third embodiment, unlike in the case of the first and second embodiments, on the whole surface of a contact hole (approximately concave trench) including its side face and its bottom face is formed a lower wiring.

Figure 5:
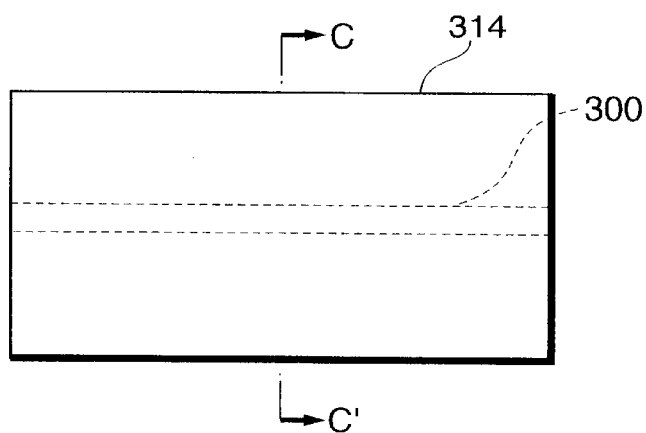
FIG. 5 a top view of a microstrip line of a semiconductor according to a third embodiment of the present invention.
Figure 6:
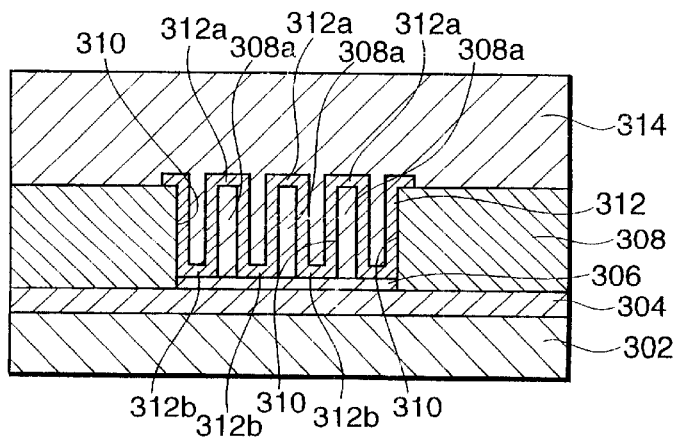
FIG. 6 is a cross-sectional view of the microstrip line of the semiconductor device of FIG. 5 taken along the line C–C' used to explain a signal line according to the third embodiment of the present invention.
Figure 7:
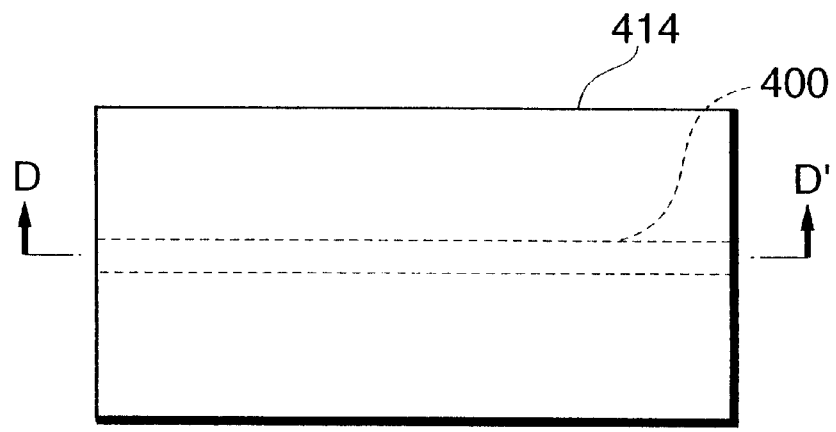
FIG. 7 is a top view of a microstrip line of a conventional semiconductor device.
Figure 8:
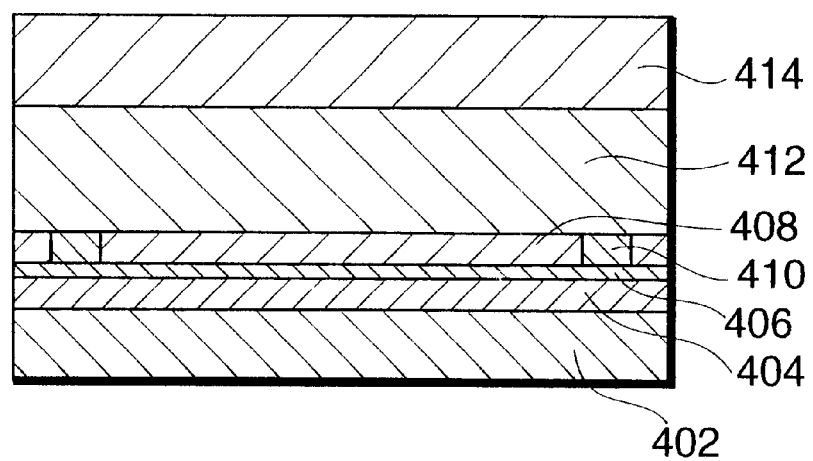
FIG. 8 is a cross-sectional view of the microstrip line of the conventional semiconductor device of FIG. 7 taken along the line D—D used to explain configurations of its signal line.

Configurations of the signal line of the third embodiment will be described below in detail by referring to FIGS. 5 and 6. FIG. 5 a top view of a microstrip line of a semiconductor according to a third embodiment of the present invention. FIG. 6 is a cross-sectional view of the microstrip line of the semiconductor device of FIG. 5 taken along the line C–C' (which, it should be noted, is perpendicular to the current flow direction established by signal line, instead of following the signal line as in FIGS. 1 and 3) used to explain a signal line according to the third embodiment.

As shown in FIG. 5, the semiconductor device of the third embodiment contains a microstrip line 300.

As shown in FIG. 6, the microstrip line 300 is provided with a GaAs substrate, a first interlayer dielectric 304 formed on the substrate and having approximately uniform thickness and a conductive path 306 and 312 formed on the first interlayer dielectric 304. The conductive path 306 includes a lower wiring 306 being a lower flat conductive layer formed on the first interlayer dielectric 304 by, for example, the deposition method. On the lower wiring 306 and the first interlayer dielectric 304 is formed a second interlayer dielectric 308. On the second interlayer dielectric 308 is formed a plurality of concave trenches 310 causing a part of the lower wiring 306 to be exposed and extending in parallel to a direction of extension of the microstrip line 300 by, for example, the etching method. The concave trench is partitioned by partition sections 308a of the second interlayer dielectric 308 left on the lower conductive layer 306.

The upper wiring 312 being the upper conductive layer is formed, as shown in FIG. 6, in a manner that it covers a surface of the interlayer dielectric 380, circumferential surface of the concave trench 310 and face of the upper conductive layer 306 being exposed to the concave trench and that it covers continuously along the concave and convex surfaces, i.e., repeatedly along a crest portion 312a and valley portion 312b in the extending direction of the microstrip line 300. The upper wiring 312 is formed by stacking a thin layer by, for example, the deposition method. The upper wiring 312 having a wavy upper layer wiring as a whole formed by repeatedly having the crest and valley portions is electrically connected to the lower wiring 306 through the contact of its valley portion 312b of the upper wiring with the lower wiring 306.

On the second interlayer dielectric 308 and upper wiring 312 is formed a passivation film 314.

Thus, according to the third embodiment, by forming a plurality of the concave trenches 310 on the second interlayer dielectric 308 on the lower wiring 306 and by forming the wavy upper wiring 312 on the whole surface of the concave trench including its bottom surface and circumferential surface, the surface area of the signal line functioning as the conductive layer (306 and 312) composed of the lower wiring 306 and upper wiring 312 is increased. Moreover, since the upper wiring 312 can be formed by stacking the thin layer by, for example, the deposition method, the signal line having more multiple layers can be formed. The direct current resistance is lowered more and the influence by the skin effect in the high-frequency signals can be reduced. Moreover, the positions of the upper wiring and lower wiring may be reversed, that is, the lower wiring 306 may be formed in the wavy shape as in the upper wiring 312 and the upper wiring 312 contacting the crest portion of the lower wiring may be formed to be flat as in the lower wiring 312.

As described above, according to the present invention, since the thickness of each of conductive layers constituting the conductive path can be made uniform and since the conductive layer is made multi-layered without any limit in terms of manufacturing methods, the direct current resistance can be fully reduced. Moreover, since high-frequency resistance can be reduced without causing the overall height of the semiconductor device to be increased, the reduction in high-frequency loss in the conductive path to transmit the high-frequency signals, such as a high-power MMIC, without causing the semiconductor device to be increased in size, is made possible.

Also, according to the present invention, by using the pin holes formed in the interlayer dielectric to form the conductive section among the conductive layers, the conductive layer can be made multi-layered comparatively easily without employing the conventional lift-off method, thus allowing, with ease, the production of the semiconductor device having less resistance loss in the conductive path.

Furthermore, according to the present invention, the surface area of the conductive path can be increased without causing dimensions of the semiconductor device in a vertical and horizontal direction to be increased and the reduction in the high-frequency resistance of the conductive path, without causing the semiconductor device to be increased in size, is made possible.

It is apparent that the present invention is not limited to the above embodiments but may be changed and modified without departing from the scope and spirit of the invention. For example, in the above embodiments, as the semiconductor substrate on which predetermined circuit devices are mounted, the GaAs substrate is employed, however, other substrate using an Si (silicon) substrate, Inp (Indium Phosphide) substrate or a like may be used as well. Moreover, in the above embodiments, the technology of the present invention is applied to the microstrip line for the high-frequency signals, however, it may be applied to other conductive path as well.

What is claimed is:
1. A semiconductor device comprising:
   a semiconductor substrate;
   a circuit device mounted on said semiconductor substrate;
   an insulating film covering said circuit device; and
   a conductive path connected to said circuit device extending on said insulating film,
   wherein said conductive path comprises a stacked structure composed of a plurality of conductive layers and of interlayer dielectrics interposed among said conductive layers, the interlayer dielectrics being so thin that they have pin holes which provide connections among said conductive layers, and wherein each of said conductive layers has approximately the same thickness.
2. The semiconductor device according to claim 1, wherein said conductive path constitutes a part of a microstrip line suitable for high-frequency currents.
3. A semiconductor device comprising:
   a semiconductor substrate;
   a circuit device formed on said semiconductor substrate;
   an insulating film covering said circuit device; and
   a conductive path connected to said circuit device formed on said insulating film, said conductive path extending in a current-flow direction;
   wherein said conductive path has, at least, an upper conductive layer and a lower conductive layer, said lower conductive layer being disposed on an approximately flat surface along said insulating film and extending in said current-flow direction, and said upper conductive layer having a cross-sectional shape that is wavy in a direction transverse to said current flow direction and that is composed of crest portions and valley portions which extend in said current-flow direction, said valley portions contacting said lower conductive layer.
4. The semiconductor device according to claim 3, wherein said crest and valley portions are defined in up and down directions with respect to said lower conductive layer.
5. The semiconductor device according to claim 3, wherein said interlayer dielectric has a plurality of concave trenches used to cause said upper conductive layer to partially expose said lower conductive layer, and wherein said upper conductive layer is formed in a continuous manner along said trenches so that it covers part of said interlayer dielectric, side and top surfaces of said concave trenches, and exposed surface portions of said lower conductive layer.
6. The semiconductor device according to claim 1, wherein each interlayer dielectric has a thickness ranging from about several Å to several tens of Å.

* * * * *